(12) United States Patent
Fujieda et al.

(10) Patent No.: US 7,710,012 B2
(45) Date of Patent: May 4, 2010

(54) CONDUCTIVE PROBE AND METHOD FOR PRODUCING THE SAME

(75) Inventors: Tadashi Fujieda, Mito (JP); Kishio Hidaka, Hitahiota (JP); Mitsuo Hayashibara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 393 days.

(21) Appl. No.: 11/734,303

(22) Filed: Apr. 12, 2007

(65) Prior Publication Data
US 2008/0067407 A1 Mar. 20, 2008

(30) Foreign Application Priority Data
Apr. 14, 2006 (JP) .............................. 2006-111499

(51) Int. Cl.
*H01J 1/62* (2006.01)
*H01J 1/00* (2006.01)

(52) U.S. Cl. ...................... 313/495; 313/309
(58) Field of Classification Search ................ 250/423; 313/495, 311, 309
See application file for complete search history.

(56) References Cited

U.S. PATENT DOCUMENTS

| | | | | |
|---|---|---|---|---|
| 6,699,642 B2 * | 3/2004 | Chung et al. | ................. | 430/313 |
| 6,720,728 B2 * | 4/2004 | Den et al. | ................. | 313/495 |
| 6,750,604 B2 * | 6/2004 | Lee et al. | ................. | 313/495 |
| 6,921,575 B2 * | 7/2005 | Horiuchi et al. | ............. | 428/367 |
| 7,044,822 B2 * | 5/2006 | Lee et al. | ....................... | 445/50 |
| 7,147,534 B2 * | 12/2006 | Chen et al. | ..................... | 445/50 |
| 7,150,801 B2 * | 12/2006 | Fujii et al. | ................... | 156/234 |
| 7,175,494 B1 * | 2/2007 | Kang et al. | .................... | 445/50 |
| 7,202,596 B2 * | 4/2007 | Tang et al. | .................. | 313/495 |
| 7,210,978 B2 * | 5/2007 | Fang | ........................... | 445/51 |
| 7,297,469 B2 * | 11/2007 | Toyota et al. | ............... | 430/315 |
| 7,355,334 B2 * | 4/2008 | Anazawa et al. | ............ | 313/495 |
| 7,612,424 B1 * | 11/2009 | Espinosa et al. | ............ | 257/415 |
| 2007/0284986 A1 * | 12/2007 | Tai et al. | ..................... | 313/309 |

FOREIGN PATENT DOCUMENTS

| | | |
|---|---|---|
| JP | 2002-255524 | 9/2002 |
| JP | 2005-063802 | 3/2005 |
| JP | 2005-276720 | 10/2005 |

\* cited by examiner

*Primary Examiner*—Nikita Wells
*Assistant Examiner*—Johnnie L Smith
(74) *Attorney, Agent, or Firm*—Antonelli, Terry, Stout & Kraus, LLP.

(57) ABSTRACT

An amorphous carbon layer sticking on a carbon nanotube surface is remarkably reduced when a carbon nanotube is joined to a conductive substrate by bringing a single fibrous carbonaceous material in contact with the tip of the conductive substrate and covering at least a part of the contact portion with a conductive material while at lest either of the fibrous carbonaceous material or the conductive substrate is heated in a vacuum.

23 Claims, 6 Drawing Sheets

CONDUCTIVE PROBE AND METHOD FOR PRODUCING THE SAME

CLAIM OF PRIORITY

The present application claims priority from Japanese application serial No. 2006-111499, filed on Apr. 14, 2006, the content of which is hereby incorporated by reference into this application.

FIELD OF THE INVENTION

The present invention relates to: a method and an apparatus for producing a conductive probe having a fibrous carbonaceous material at the tip thereof; and further a conductive probe suitable for use in an electron beam application device including an electron microscope.

BACKGROUND OF THE INVENTION

In recent years, in the field of scanning probe microscopy, a probe is required to be sharpened from the viewpoint of the trend of a higher resolution. In response to the trend, Japanese Unexamined Patent Publication No. 276720/2005 proposes to form the tip of a probe with a single carbon nanotube or bundled plural carbon nanotubes (for example, about one to several tens nanometers in diameter).

When a conductive probe using carbon nanotubes (CNT) is used as the electron source of an electron microscope, some conductive probes have developed the problem in that the pattern of the electron beam is unstable and the emission current varies widely.

SUMMARY OF THE INVENTION

An object of the present invention is to provide: an electron source that yields a stable emission current having a high intensity and a narrow energy width; and also an electron beam application device on which the electron source is mounted.

A method for producing a conductive probe according to the present invention is characterized by fixing a fibrous carbonaceous material to the tip of a conductive substrate while at lest either of the fibrous carbonaceous material or the conductive substrate is heated in a vacuum. Then in the fixation, it is preferable to: bring the single fibrous carbonaceous material in contact with the tip of the conductive substrate; and coat at least a part of the contact portion with a conductive material.

An apparatus to produce a conductive probe according to the present invention that solves the above challenge of the present invention is characterized in that the apparatus has a heating means for heating at least either of the fibrous carbonaceous material or the conductive substrate. It is particularly convenient to have: a first retainer to retain the fibrous carbonaceous material; a second retainer to retain the conductive substrate; and a means for heating at least one of the retainers.

A conductive probe produced by a method according to the present invention comprises a fibrous carbonaceous material and a conductive substrate to support the fibrous carbonaceous material and the thickness of an amorphous carbon layer with which the fibrous carbonaceous material is covered is 2 nm or less. Further, in the conductive probe, a coat comprising a conductive material is formed at the portion where the fibrous carbonaceous material touches the conductive substrate to support the fibrous carbonaceous material.

When a conductive probe according to the present invention is used as a field-emission electron source in one of the various kinds of electron beam application devices such as a field-emission electron gun, an electron microscope, a length-measuring SEM, an electron beam drawing device, and the like, it is possible to obtain a highly stable emission current having a high intensity and a narrow energy width.

As a result of the study on the causes of the above problem, it has been clarified that an amorphous carbon layer existing at the tip of a carbon nanotube exerts a harmful influence on the field emission characteristics. FIG. 1 is an SEM photograph of the tip of a carbon nanotube in the case of a field-emission electron source formed by joining a single carbon nanotube to a conductive substrate. From the photograph, it is understood that the amorphous carbon layer 1 (the part of the dotted lines in the photograph) exists at the outermost layer of the graphite layer 2 of the carbon nanotube. The carbon nanotube is joined to the conductive substrate in an electron microscope. A trifle amount of hydrocarbon exists in a specimen chamber of an electron microscope and, when a carbon nanotube is irradiated with an electron beam, the hydrocarbon is decomposed and amorphous carbon forms on the surface of the carbon nanotube.

In view of the above situation, the present inventors provide a joining method capable of largely reducing an amorphous carbon layer that sticks on the surface of a carbon nanotube when the carbon nanotube is joined to a conductive substrate.

The present invention makes it possible to provide a joining method capable of largely reducing an amorphous carbon layer that sticks on the surface of a carbon nanotube when the carbon nanotube is joined to a conductive substrate. Further, the present invention makes it possible to provide: an electron source that yields a highly stable emission current having a high intensity and a narrow energy width; and an electron beam application device on which the electron source is mounted.

DETAILED DESCRIPTION OF THE PREFERRED EMBODIMENT

The embodiments of the present invention are hereunder explained in reference to drawings.

Embodiment 1

Figure 2:
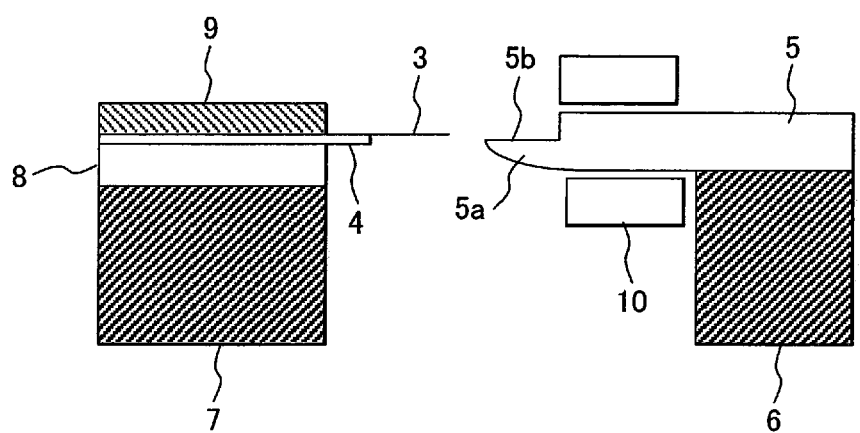
FIG. 2 is a sectional view showing the substantial parts of an apparatus to produce a conductive probe, according to the present invention.

FIG. 2 is a sectional view showing the substantial part of an apparatus to produce a conductive probe according to the present invention. The conductive probe is produced in a scanning electron microscope (SEM). A carbon nanotube cartridge 4 wherein carbon nanotubes 3 are dispersed and oriented at the edge of a blade-shaped metal plate and a conductive substrate 5 (for example, 0.15 mm in diameter) having an acicular end 5a obtained by forming an end of the conductive substrate into a conical shape are attached onto independently movable stages 6 and 7 respectively in a three dimensional manner.

One of the features of a method for producing a conductive probe according to the present invention is to heat at least a carbon nanotube cartridge or a conductive substrate where the carbon nanotube to be bonded is placed or supported in order to prevent formation of an amorphous carbon layer that sticks to the carbon nanotube when the carbon nanotube is joined to the conductive substrate while they are observed in an SEM.

As a heating method, indirect heating with a heater or direct heating by electrical heating or the like may be adopted. In the case of the present embodiment, as shown in FIG. 2, a sheet heater 8 was disposed between the carbon nanotube cartridge 4 and the movable stage 7, those were fixed with a metal plate 9, and the carbon nanotube cartridge 4 was heated to 180° C. and maintained at the temperature. The conductive substrate 5 was heated to 150° C. through radiant heat with a ring-shaped heater 10 and maintained at the temperature.

As a result of heating, it was observed that amorphous carbon came to hardly stick to a CNT by heating the CNT at 80° C. to 300° C. in the case of any carbon nanotubes. Here, when the heating temperature was too high, the problem was that a SEM image drifted at the time of joining or the Vander Waals' forces did not function between a CNT and a substrate, and thereby the CNT came to hardly stick to the conductive substrate.

Further, the CNT tip is a field emission site and hence to prevent amorphous carbon from sticking to the site is most important. Therefore, there was no major problem even when only the cartridge side was heated. On the other hand, when the substrate was heated, the CNT could be joined without sticking amorphous carbon to the joint face and resultantly a layer of a high electric resistance was not formed and the contact resistance could be kept low.

Here, a planar face 5b was formed at the acicular end 5a of the conductive substrate 5. The carbon nanotube 3 was brought in contact with and fixed to the planar face 5b in parallel with the center axis of the conductive substrate 5. The carbon nanotube 3 was brought in contact with the planar face 5b of the acicular end 5a, a coat comprising a conductive material was formed at an appropriate interval or continuously at the portion where the carbon nanotube 3 touched the acicular end 5a, and thereby the carbon nanotube 3 was firmly fixed to the planar face 5b of the acicular end 5a. The carbon nanotube may widely be covered with the conductive coating layer as shown in FIG. 3 or several parts of the carbon nanotube may be covered with the conductive coating layer 12 as shown in FIG. 4(a).

It is preferable that the planar face 5b is a plane that passes through the tip of the acicular end 5a and is parallel with the axis of the cone. However, the planar face 5b is not limited to the case, but may be a planar face that passes through the vicinity of the tip of the acicular end 5a and has an angle to the axis of the cone within a certain range. The important point is that, in consideration of the allowance of the emission angle of an electron beam emitted from the tip of the carbon nanotube 3, for example the angle between the center axis of the conductive substrate 5 and the tip of the carbon nanotube 3 is set at ±3° or less and thereby the adjustment of the optical axis of the electron beam can be facilitated. Here, the planar face can be formed by FIB machining or the like.

Figure 3:
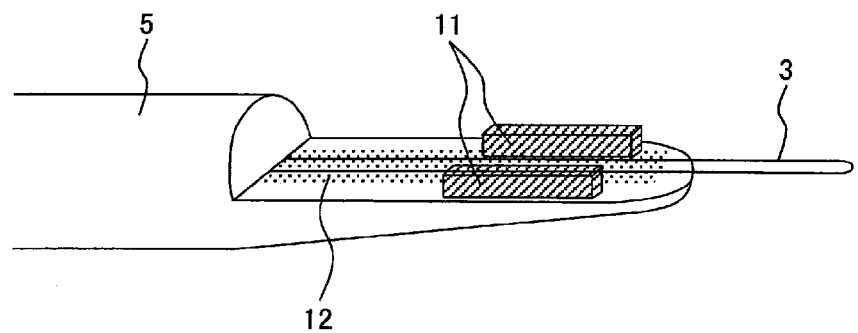
FIG. 3 is a perspective view of a conductive probe produced by forming a carbon nanotube attachment guide with a conductive coating material according to an example of the present invention and joining a carbon nanotube to a conductive substrate.
Figure 4:
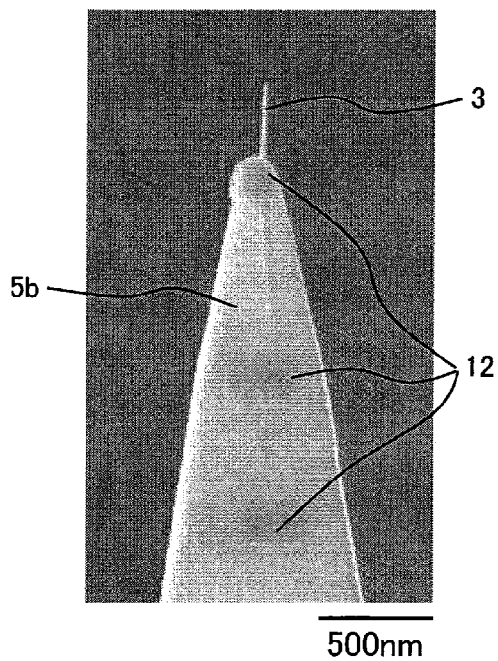
FIG. 4(a) is an SEM photograph of a conductive probe tip according to the present invention.
FIG. 4(b) is a TEM photograph of a carbon nanotube tip.
Figure 4:
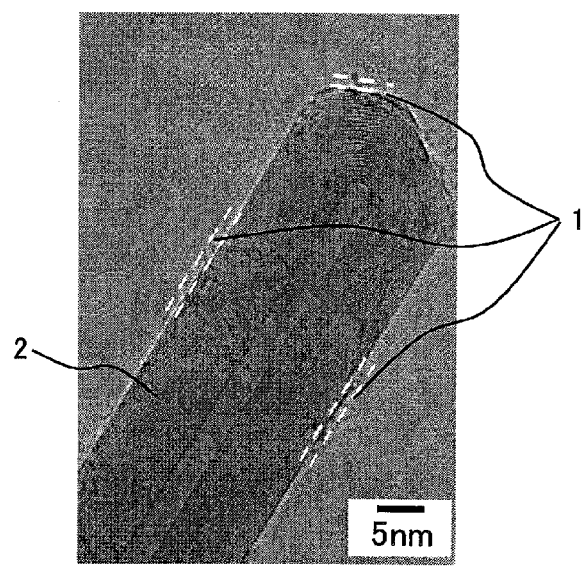

Further, in order to control the angle of the attached carbon nanotube to the center axis of the conductive substrate, it is possible to form carbon nanotube attachment guides 11 with a conductive coating material 12 as shown in FIG. 3.

A method for forming a coat of a conductive material is explained in detail. A gas containing a conductive element is introduced into a specimen chamber of an electron microscope and at least a part of the contact portion is irradiated with an electron beam. As the gas, an organic metal gas containing carbon and a metal such as platinum, gold, tungsten or the like, a fluorinated gas, or the like, those gases decomposing with an electron beam of 5 to 100 keV and vaporizing at 100° C. or lower, is preferably used. As the gas containing a conductive element, a gas that only decomposes with a high-energy heavy ion beam such as a gallium ion beam or the like that is generally used in FIB machining or the like cannot be used. The reason is that, if the carbon nanotube is irradiated with gallium ions, the carbon nanotube itself is instantaneously damaged and hence breakage and irradiation defects occur. Likewise, as a particle beam used for the decomposition of a gas, an electron beam of 5 to 100 keV that does not cause damages to the carbon nanotube is preferably used. By forming a conductive material by the above method, it is possible to form a coat of a sufficient thickness for a short period of time.

Figure 1:
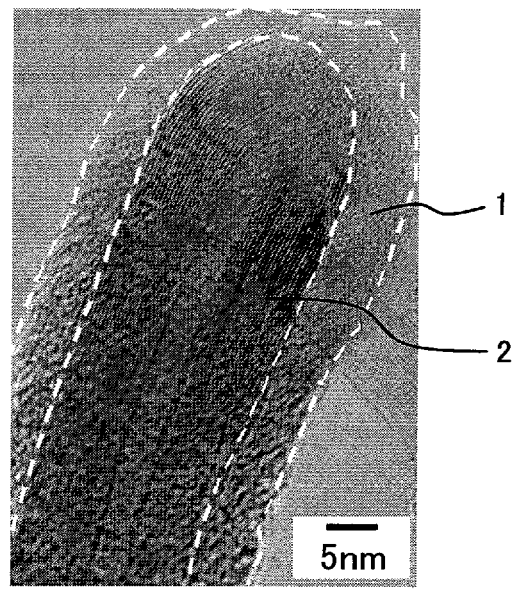
FIG. 1 is an SEM photograph of a carbon nanotube tip of a field-emission electron source formed by joining a single carbon nanotube to a conductive substrate by a conventional method.

FIGS. 4(a) and 4(b) shows electron microscopic photographs of a conductive probe produced by the aforementioned method. FIG. 4(a) is an SEM photograph of a conductive probe tip, and FIG. 4(b) is a transparent electron microscopic (TEM) photograph of a carbon nanotube tip. As it is obvious from the comparison with FIG. 1, by heating the carbon nanotube cartridge and the conductive substrate, it is possible to considerably reduce the amount of the amorphous carbon sticking to the carbon nanotube tip.

The field electron emission patterns were investigated with an FEM (Field Emission Microscope) when the thicknesses of the amorphous carbon layers of carbon nanotubes were varied. The results are shown in FIGS. 5(a) and 5(b).

Figure 5:
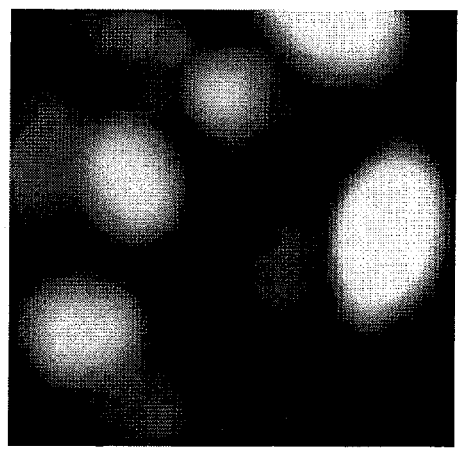
FIG. 5(a) is an FEM (Field Emission Microscope) image of a carbon nanotube electron source produced by a conventional production method.
FIG. 5(b) is an FEM (Field Emission Microscope) image of a carbon nanotube electron source produced by a method according to the present invention.
Figure 5:
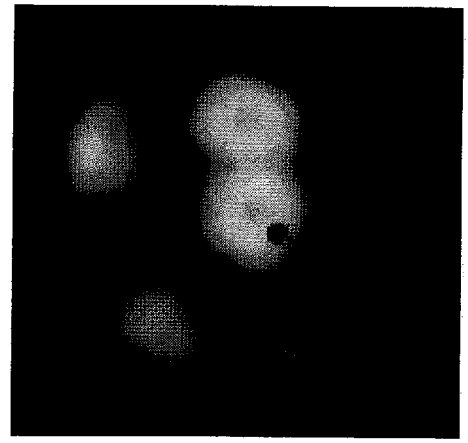

FIG. 5(a) represents the case where the carbon nanotube cartridge and the conductive substrate were not heated and the thickness of the amorphous carbon layer at the electron emission face of the carbon nanotube tip was 5 nm. A generally obscure FEM image as shown in FIG. 5A was obtained. The electron emission face was the outermost surface at the carbon nanotube tip and was the face comprising a five-membered ring that was the electron emission site and a six-membered ring. Here, a part of the six-membered ring may be replaced with a seven-membered ring in some carbon nanotube tip shapes.

FIG. 5(b) represents the case where the carbon nanotube cartridge and the conductive substrate were heated and the thickness of the amorphous carbon layer at the electron emission face of the carbon nanotube tip was 2 nm or less. An FEM image comprising plural five-membered ring patterns each of which reflects a five-membered ring as the electron emission site was obtained as shown in FIG. 5(b). A typical five-membered ring pattern shows nearly a pentagon having a dark center portion as shown in FIG. 5(b) but sometimes an observed pentagon is somewhat distorted due to the arrangement of the five-membered ring. It was found that the electron emission face of a carbon nanotube was kept clean when a substrate or a cartridge was joined while being heated.

Figure 6:
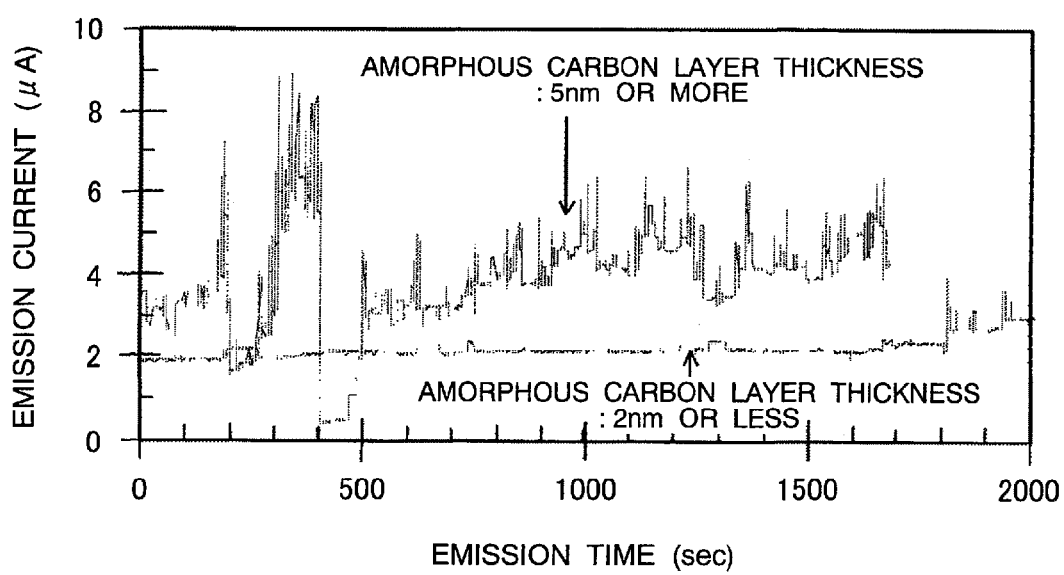
FIG. 6 is a graph showing (a) variation on time of field emission current of a carbon nanotube electron source produced by a conventional production method and (b) variation on time of field emission current of a carbon nanotube electron source produced by a method according to the present invention.

Successively, influence of an amorphous carbon layer at a carbon nanotube tip on the stability of an emission current was investigated. The results are shown in FIG. 6.

In the case of a sample having an amorphous carbon layer about 5 nm in thickness, electric current was unstable and fluctuated largely. On the other hand, in the case where the thickness of an amorphous carbon layer was about 2 nm, the electric current was remarkably stabilized in contrast to the case where the thickness of an amorphous carbon layer was 5 nm. For the reason, it is necessary to control the thickness of an amorphous carbon layer to less than 5 nm.

From the above results, it has been found that a conductive probe that can stabilize emission current can be provided by forming an adhesion layer while the carbon nanotube is heated.

Further, the forming of an amorphous carbon layer having a high resistance on the joint surface of a conductive substrate was suppressed by heating the conductive substrate and maintaining the temperature, and thus the contact resistance between a carbon nanotube and the conductive substrate could be lowered. The contact resistance was 100 kO or more in the case of no heating and less than 10 kO in the case of heating, namely, the contact resistance in the case of heating lowered by about two digits from the case of not heating the conductive substrate.

Example 1

Application to an Electron Beam Application Device

Figure 7:
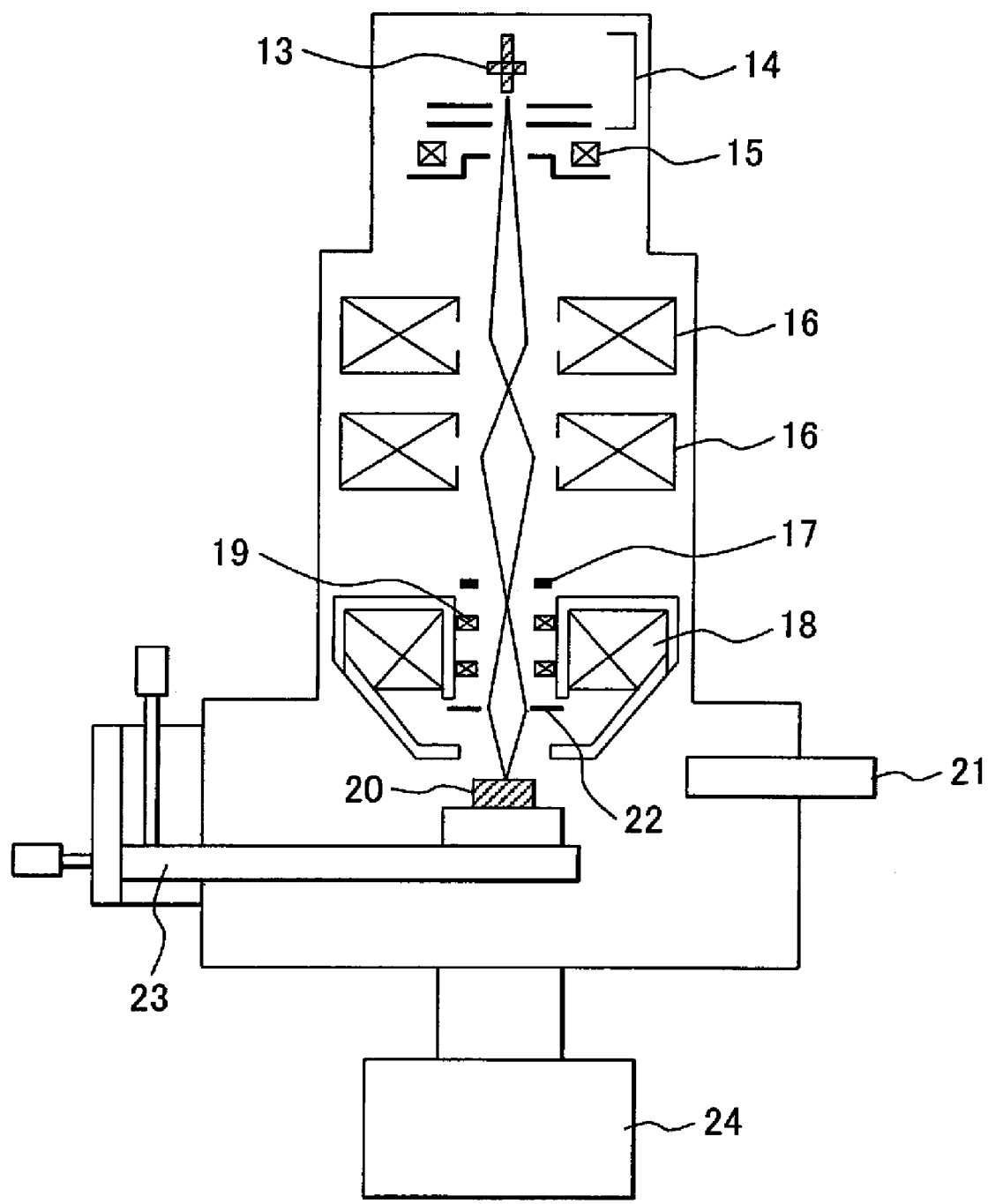
FIG. 7 is a general configuration view of a scanning electron microscope (SEM) wherein an electron source according to the present invention is used.

A general configuration view of a scanning electron microscope (SEM) wherein a conductive probe according to the present invention is used as a field-emission electron source is shown in FIG. 7. A scanning electron microscope was provided with, in sequence along the flow of an electron beam emitted from an electron gun, an alignment coil 15, a condenser lens 16, an astigmatic correction coil 17, a deflecting and scanning coil 19, an objective lens 18, and an objective lens aperture 22. A specimen 20 was placed on a specimen stage 23 and irradiated with an electron beam. A secondary electron detector 21 was disposed on the side wall in a specimen chamber. Further, the specimen chamber was maintained at a high degree of vacuum through an exhaust system 24. By the configuration, an electron beam emitted from an electron gun: was accelerated with an anode; converged with an electron lens; and was applied to a minute region on a specimen. The irradiation region was two-dimensionally scanned, secondary electrons, reflected electrons, and the like emitted from the specimen were detected with a secondary electron detector, and an enlarged image was formed on the basis of the difference of the detected signal volumes.

By applying a conductive probe according to the present invention as a field-emission electron source to a scanning electron microscope, it is possible to realize the scanning electron microscope that can form a secondary electron image and a reflected electron image stably for a long period of time. Further, the resultantly obtained image has a high resolution and a high intensity.

Here, the configuration of a scanning electron microscope is not limited to the example shown in FIG. 7 and a conventional configuration can be adopted as long as the configuration can fully exhibit the characteristics of a field-emission electron source according to the present invention.

Further, the basic configuration of the electro-optic system of a length-measuring SEM used for the observation and dimension measurement of a finely formed pattern in a semiconductor process is the same as that shown in FIG. 7. Therefore, similar results are obtained by applying a conductive probe according to the present invention to the field-emission electron source of a length-measuring SEM.

Example 2

Application to an Electron Beam Application Device

Figure 8:
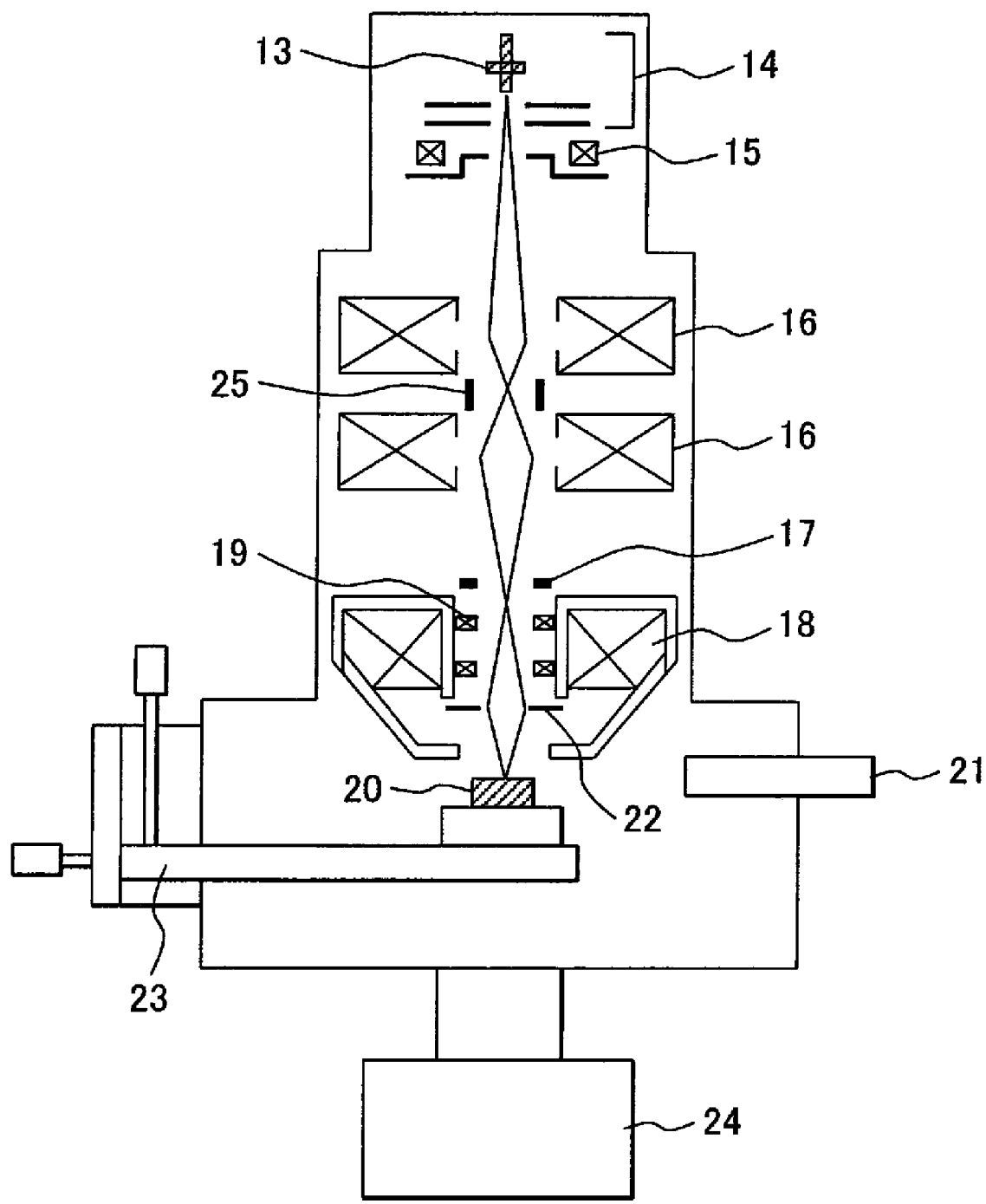
FIG. 8 is a general configuration view of an electron beam drawing device wherein an electron source according to the present example is used.

FIG. 8 is a general configuration view of an electron beam drawing device wherein a conductive probe according to the present invention is used as a field-emission electron source. The basic configuration of the electro-optic system is nearly the same as that of the aforementioned scanning electron microscope. The same reference numerals as those of FIG. 7 denote the same elements or corresponding elements. Detailed explanation thereof is omitted to avoid superfluousness.

An electron beam obtained by field emission from an electron gun 14 was stopped down with a condenser lens 16 and focused on a specimen with an objective lens 18, and thus a beam spot of a nanometer order was obtained. On this occasion, it was preferable that the center of a blanking electrode 25 to control on/off of the electron beam irradiation onto the specimen coincided with the crossover point formed with the condenser lens.

Electron beam drawing was carried out by irradiating a specimen while an electron beam was: turned on or off with a blanking electrode; and polarized and used for scanning on the specimen with a deflecting and scanning coil 19.

The function of an electron beam drawing device is to: irradiate a specimen substrate coated with a resist sensitive to an electron beam with an electron beam; and form various circuit patterns. Thus as higher definition of various circuit patterns advances, the miniaturization of an electron beam probe diameter is required. By applying a field-emission electron source according to the present invention, a very fine probe diameter causing an outstandingly high intensity is obtained in comparison with conventional devices and hence electron beam drawing of high efficiency and high definition can be obtained.

Figure 9:
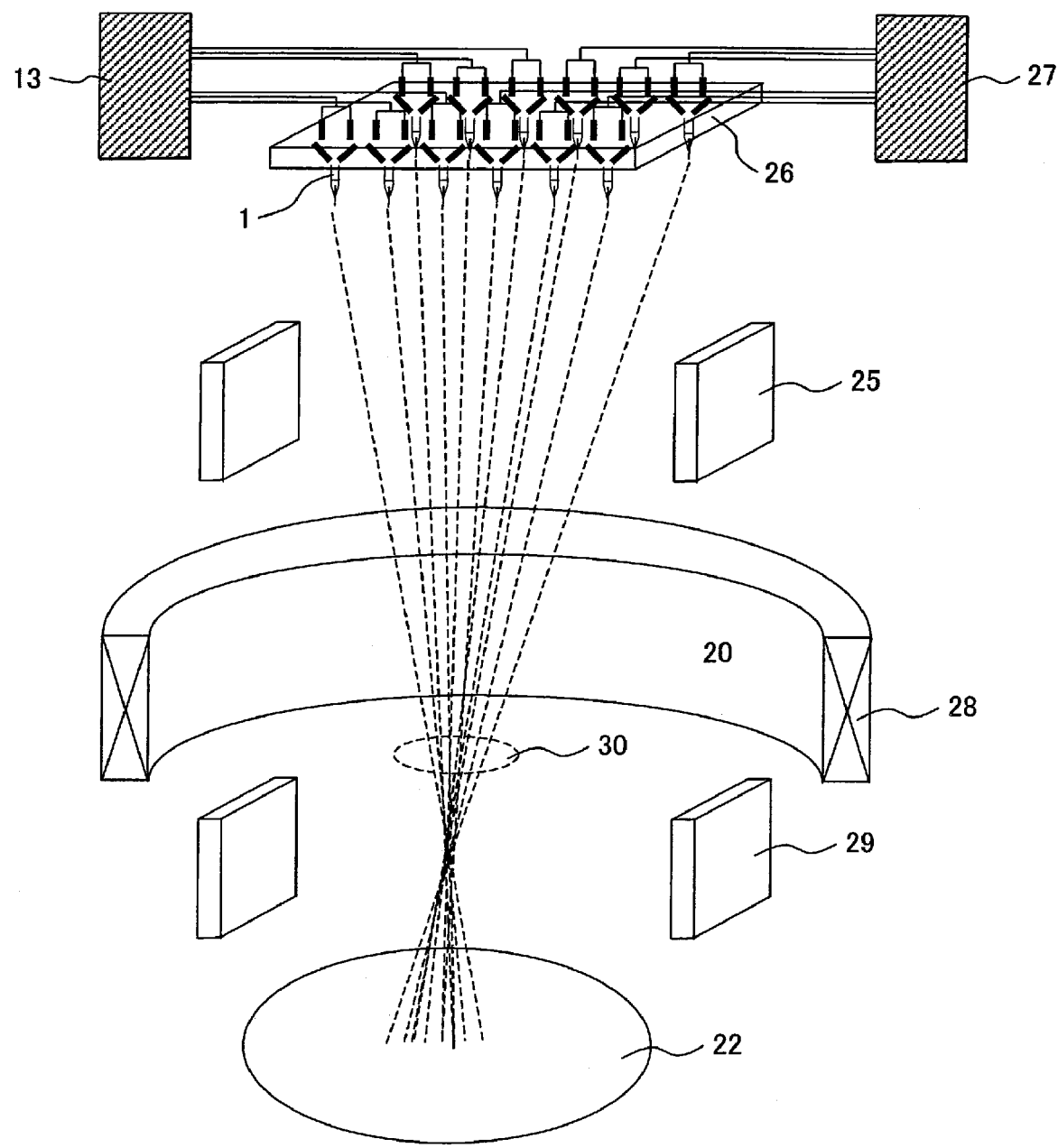
FIG. 9 is a view showing the electro-optic system configuration of an electron beam drawing device wherein an electron source according to the present example and an electron gun according to the present example are used.

Here, as shown in FIG. 9, by mounting a plurality of field-emission electron sources according to the present invention so as to be able to apply voltage to each of electron sources independently, it is possible to simultaneously irradiate a specimen with plural electron beams for collective drawing, and hence drawing efficiency can dramatically be improved.

In FIG. 9, a plurality of field-emission electron sources each having a carbon nanotube 1 are supported on a electron source supporter 26, and the electron sources are driven by a electron source drive circuit 27. Electron beam 30 is emitted and focused on the object lens aperture 22. Electron lens 28 is arranged to surround the electron beam 30. Deflectors 29 are positioned in opposite relation with respect to the electron beam.

What is claimed is:

1. A method for producing a conductive probe by fixing a fibrous carbonaceous material to a conductive substrate, the method comprising:
    coating the portion where the carbonaceous material touches the conductive substrate with a conductive material, and
    fixing the carbonaceous material to the substrate under irradiation with an electron beam in vacuum, wherein the carbonaceous material is heated during the fixing.

2. A method for producing a conductive probe according to claim 1, wherein the carbonaceous material is fixed to the conductive substrate by bringing the carbonaceous material close to the conductive substrate while a first retainer to retain the carbonaceous material is heated.

3. A method for producing a conductive probe according to claim 1, wherein the carbonaceous material is fixed to the conductive substrate while the conductive substrate is heated and maintained at a predetermined temperature or higher.

4. An apparatus to produce a conductive probe comprising:
    a first retainer to retain a carbonaceous material;
    a second retainer to retain a conductive substrate to which the carbonaceous material is fixed;
    an irradiating device for irradiating the carbonaceous material in vacuum; and
    a means for heating the carbonaceous material and the first retainer.

5. A field-emission electron gun comprising:
    a field-emission electron source,
    an extractor to field-emit electrons from the field-emission electron source, and
    an accelerator to accelerate the electrons,
    wherein the field-emission electron source has a conductive probe comprising a single fibrous carbonaceous material and a conductive substrate to support the carbonaceous material; and the fibrous carbonaceous material is covered with an amorphous carbon layer 2 nm or less in thickness,
    wherein the carbonaceous material and the conductive substrate are bonded under irradiation with an electron beam in vacuum, while the carbonaceous material is heated in vacuum.

6. A field-emission electron gun comprising:
    a field-emission electron source,
    an extractor to field-emit electrons from the field-emission electron source, and
    an accelerator to accelerate the electrons,
    wherein the field-emission electron source has a conductive probe comprising a single fibrous carbonaceous material and a conductive substrate to support the carbonaceous material; and the electron emission face of the fibrous carbonaceous material is covered with an amorphous carbon layer 2 nm or less in thickness,
    wherein the carbonaceous material and the conductive substrate are bonded under irradiation with an electron beam in vacuum, while the carbonaceous material is heated in vacuum.

7. A field-emission electron gun comprising:
    a field-emission electron source,
    an extractor to field-emit electrons from the field-emission electron source, and
    an accelerator to accelerate the electrons,
    wherein the field-emission electron source has a conductive probe formed by firmly fixing a single fibrous carbonaceous material to a conductive substrate to support the carbonaceous material with a conductive coating layer having a ayer of amorphous carbon of 2 nm or less; and the pattern of electrons field-emitted from the field-emission electron source comprises at least a five-membered ring pattern,
    wherein the carbonaceous material and the conductive substrate are bonded under irradiation with an electron beam in vacuum, while the carbonaceous material is heated in vacuum.

8. A method for producing a conductive probe by fixing a fibrous carbonaceous material to a conductive substrate according to claim 1, wherein a planar face is formed at the tip of a conductive member to which a carbon nanotube is fixed.

9. A method for producing a conductive probe by fixing a fibrous carbonaceous material to a conductive substrate according to claim 1, wherein the temperature of heating the carbonaceous material is from 80° C. to 300° C.

10. A method for producing a conductive probe according to claim 1, wherein the carbonaceous material is a carbon nanotube.

11. A method for producing a conductive probe according to claim 2, wherein the carbonaceous material is a carbon nanotube.

12. An apparatus to produce a conductive probe according to claim 4, wherein the carbonaceous material is a carbon nanotube.

13. A field-emission electron gun according to claim 5, wherein the carbonaceous material is a carbon nanotube.

14. A field-emission electron gun according to claim 6, wherein the carbonaceous material is a carbon nanotube.

15. A field-emission electron gun according to claim 7, wherein the carbonaceous material is a carbon nanotube.

16. An apparatus to produce a conductive probe according to claim 4, wherein a planar face is formed at the tip of a conductive member to which a carbon nanotube is fixed.

17. A field-emission electron gun according to claimS, wherein a planar face is formed at the tip of a conductive member to which a carbon nanotube is fixed.

18. A field-emission electron gun according to claim 6, wherein a planar face is formed at the tip of a conductive member to which a carbon nanotube is fixed.

19. A field-emission electron gun according to claim 7, wherein a planar face is formed at the tip of a conductive member to which a carbon nanotube is fixed.

20. A method for producing a conductive probe according to claim 1, wherein fixing the carbonaceous material to the substrate under irradiation with an electron beam in vacuum of an electron microscope.

21. A field-emission electron gun according to claim 5, wherein the carbonaceous material and the conductive substrate are bonded under irradiation with an electron beam in vacuum of an electron microscope.

22. A field-emission electron gun according to claim 6, wherein the carbonaceous material and the conductive substrate are bonded under irradiation with an electron beam in vacuum of an electron microscope.

23. A field-emission electron gun according to claim 7, wherein the carbonaceous material and the conductive substrate are bonded under irradiation with an electron beam in vacuum of an electron microscope.

* * * * *